(12) United States Patent
Srinivasan et al.

(10) Patent No.: US 9,378,809 B1
(45) Date of Patent: Jun. 28, 2016

(54) RELAXING VERIFICATION CONDITIONS IN MEMORY PROGRAMMING AND ERASURE OPERATIONS

(71) Applicant: APPLE INC., Cupertino, CA (US)

(72) Inventors: Charan Srinivasan, Cupertino, CA (US); Eyal Gurgi, Herzliya Pituach (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/818,328

(22) Filed: Aug. 5, 2015

(51) Int. Cl.
  *G11C 16/10* (2006.01)
  *G11C 11/56* (2006.01)
  *G11C 7/00* (2006.01)

(52) U.S. Cl.
  CPC . *G11C 11/56* (2013.01); *G11C 7/00* (2013.01)

(58) Field of Classification Search
  CPC .............................. G11C 27/005; G11C 16/10
  USPC ................................................ 365/45, 185.24
  See application file for complete search history.

(56) References Cited

U.S. PATENT DOCUMENTS

| 8,631,288 | B2 | 1/2014 | Helm et al. |
| 8,787,094 | B2 | 7/2014 | Costa et al. |
| 9,019,775 | B2 | 4/2015 | Costa et al. |
| 2011/0128790 | A1* | 6/2011 | Sarin ................ G11C 11/5642 365/185.19 |
| 2011/0310673 | A1* | 12/2011 | Cho .................... G11C 16/0483 365/185.22 |
| 2012/0151301 | A1 | 6/2012 | Izumi et al. |
| 2013/0094294 | A1* | 4/2013 | Kwak ................. H01L 27/1157 365/185.03 |
| 2013/0258774 | A1* | 10/2013 | Visconti ................ G11C 16/10 365/185.09 |
| 2014/0029337 | A1* | 1/2014 | Shibata ............. G11C 11/5628 365/185.03 |
| 2014/0082460 | A1 | 3/2014 | Pangal et al. |
| 2014/0098615 | A1 | 4/2014 | Mu et al. |
| 2014/0104950 | A1* | 4/2014 | Yano ...................... G11C 16/10 365/185.12 |
| 2014/0160848 | A1 | 6/2014 | Dutta et al. |
| 2014/0204675 | A1* | 7/2014 | Cho .................... G11C 16/0483 365/185.17 |
| 2014/0269083 | A1* | 9/2014 | Mui .................... G11C 11/5642 365/185.17 |

* cited by examiner

*Primary Examiner* — Michael Tran
(74) *Attorney, Agent, or Firm* — D. Kligler IP Services Ltd.

(57) ABSTRACT

A method for data storage includes setting a plurality of memory cells to hold respective target analog values, by applying to the memory cells a sequence of iterations, each iteration includes attempting to set the target analog values and then verifying whether the target analog values have been reached in accordance with a verification condition. After applying a predefined number of the iterations, the verification condition is relaxed and a condition of whether the target analog values have been reached in accordance with the relaxed verification condition is verified.

18 Claims, 2 Drawing Sheets

RELAXING VERIFICATION CONDITIONS IN MEMORY PROGRAMMING AND ERASURE OPERATIONS

TECHNICAL FIELD

Embodiments described herein relate generally to data storage, and particularly to methods and systems for programming and erasing non-volatile memory.

BACKGROUND

Memory cells in non-volatile memory devices typically store data by holding respective analog values representing the data. Memory cells programmed with certain data are typically erased before being rewritten with other data. Various methods for erasing and programming non-volatile memory cells are known in the art. For example, U.S. Pat. No. 8,787,094, whose disclosure is incorporated herein by reference, describes an erase operation for a 3D stacked memory device that selectively inhibits subsets of memory cells which meet a verify condition as the erase operation progresses. As a result, faster-erasing memory cells are less likely to be over-erased. Each subset of memory cells can be independently erased by controlling a select gate, drain (SGD) transistor line, a bit line or a word line, according to the type of the subset. An inhibit status can be maintained for each subset, and each type of subset can have a different maximum allowable number of fail bits.

U.S. Patent Application Publication 2014/0098615, whose disclosure is incorporated herein by reference, describes a method for detecting latent slow erase bits in a non-volatile memory (NVM). At least a portion of an array of NVM cells is erased with a reduced erase bias. The reduced erase bias has a reduced level relative to a normal erase bias. A least erased bit (LEB) threshold voltage level of the least erased bit (LEB) is determined. An erase verify is performed at an adjusted erase verify read threshold voltage level. The adjusted erase verify read threshold voltage level is a predetermined amount lower than the LEB read threshold voltage level. A number of failing bits is determined. The failing bits are bits with a threshold voltage above the adjusted erase verify level. The NVM is rejected in response to the number of failing bits being less than a failing bits threshold.

U.S. Patent Application Publication 2014/0082460, whose disclosure is incorporated herein by reference, describes dynamic control of a program-erase window in a NAND memory device. In one embodiment, the program-erase window is dynamically varied by starting with a higher erase verify (TEV) voltage and lowering the TEV voltage in subsequent program/erase cycles over the life time of the NAND memory device based on the current cycle count value. Alternatively, the program-erase window is dynamically varied by starting with a higher program verify (PV) voltage and erase verify (TEV) voltage and lowering the PV and TEV voltages in subsequent program/erase cycles based on the current cycle count value.

SUMMARY

An embodiment that is described herein provides a method for data storage, including setting a plurality of memory cells to hold respective target analog values, by applying to the memory cells a sequence of iterations, each iteration includes attempting to set the target analog values and then verifying whether the target analog values have been reached in accordance with a verification condition. After applying a predefined number of the iterations, the verification condition is relaxed and a condition of whether the target analog values have been reached in accordance with the relaxed verification condition is verified.

In some embodiments, verifying whether the target analog values have been reached in accordance with the relaxed verification condition includes applying one or more additional iterations using the relaxed verification condition. In other embodiments, verifying whether the target analog values have been reached includes notifying a number of the memory cells failing to meet the relaxed verification condition after applying a predefined number of the additional iterations. In yet other embodiments, verifying whether the target analog values have been reached includes counting a number of the memory cells whose analog values do not meet a verification threshold, and deciding that the verification condition is met when the counted number does not exceed a predefined permitted count. In yet further other embodiments, relaxing the verification condition includes increasing the predefined permitted count.

In an embodiment, relaxing the verification condition includes adjusting the verification threshold. In another embodiment, setting the plurality of the memory cells includes programming the memory cells with data, counting the number of the memory cells includes identifying the memory cells whose analog values fall below the verification threshold, and relaxing the verification condition includes decreasing the verification threshold. In yet another embodiment, setting the plurality of the memory cells includes erasing the memory cells, counting the number of memory cells includes identifying the memory cells whose analog values fall above the verification threshold, and relaxing the verification condition includes increasing the verification threshold.

In some embodiments, the method includes classifying the analog values of the memory cells whose analog values do not meet the verification threshold into two or more verification zones, and verifying whether the target analog values have been reached includes counting per-zone numbers of the memory cells in the respective verification zones and verifying whether the target analog values have been reached based on the counted per-zone numbers. In other embodiments, verifying whether the target analog values have been reached includes using a respective different permitted count per verification zone. In yet other embodiments, the verification zones include a first zone having a first number of the memory cells and a second zone having a second number of the memory cells, the first zone being closer to the verification threshold than the second zone, and verifying whether the target analog values have been reached includes comparing the first number to a first permitted count and comparing the second number to a second permitted count that is smaller than the first permitted count.

In an embodiment, relaxing the verification condition includes determining an extent by which to relax the verification condition based on at least one factor selected from a group consisting of correction capability of an Error Correction Code (ECC) used for the data storage, a count of program and erase (P/E) cycles applied previously to the memory cells, and a number of the memory cells that met the verification threshold for the first time in a most recent iteration.

There is additionally provided, in accordance with an embodiment that is described herein, apparatus for data storage including a plurality of memory cells and storage circuitry. The storage circuitry is configured to set the plurality of memory cells to hold respective target analog values, by applying to the memory cells a sequence of iterations, and in each iteration the storage circuitry is configured to attempt to set the target analog values and then to verify whether the target analog values have been reached in accordance with a verification condition, and, after applying a predefined number of the iterations, to relax the verification condition and to verify whether the target analog values have been reached in accordance with the relaxed verification condition.

These and other embodiment will be more fully understood from the following detailed description of the embodiments thereof, taken together with the drawings in which:

DETAILED DESCRIPTION OF EMBODIMENTS

Overview

Figure 1:
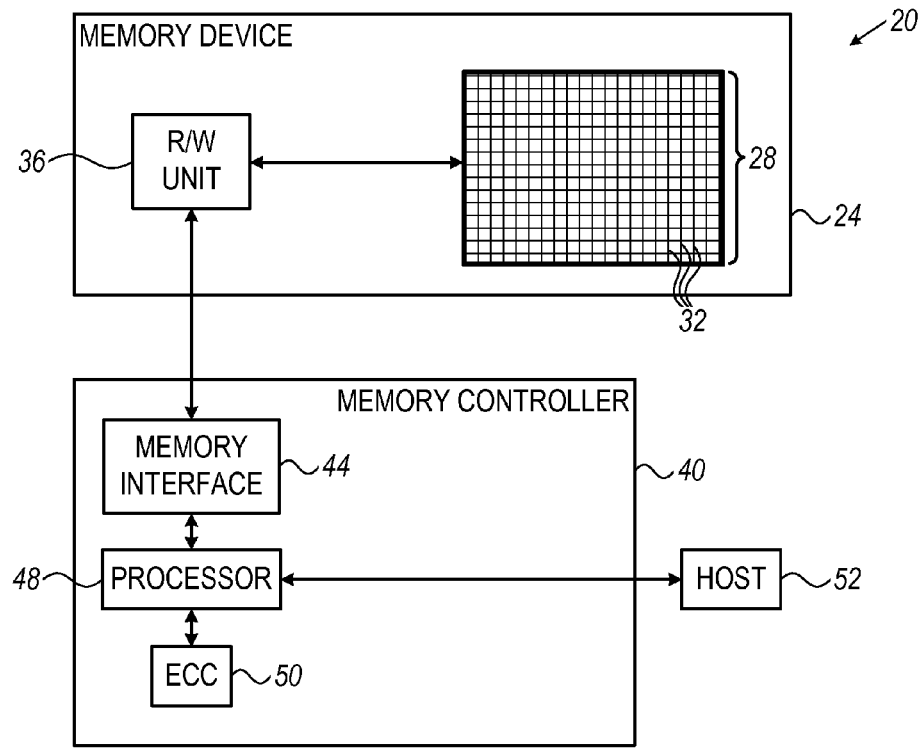
FIG. 1 is a block diagram that schematically illustrates a memory system, in accordance with an embodiment that is described herein.

In some non-volatile memory devices, data is stored by programming the memory cells to respective analog values or levels representing the data. Embodiments that are disclosed herein provide improved methods and systems for programming and erasing memory cells. A programming or erasure procedure may, for example, apply a sequence of program-and-verify (P&V) or erase-and-verify (E&V) iterations, respectively, wherein in each iteration the memory device attempts to set the memory cells to the desired programming or erase level and then verify whether the operation has succeeded in accordance with some verification condition.

For example, a verification condition for programming (or erasure) may require that the number of memory cells whose values fail to reach a given verification threshold does not exceed a predefined permitted count. Passing above or below the verification threshold, for program and erase, respectively, is referred to herein as "meeting the verification threshold". The number of memory cells that fail to meet the verification threshold in a given iteration is also referred to herein as a "fail bit count."

The parameters defining the verification condition, e.g., the verification threshold and the permitted count, should be selected to ensure reliable reading of the programmed cells over the life time of the device, during which the device may suffer performance degradation due to various reasons such as program disturb, read disturb and/or drift after a long period of retention.

Selecting the parameters of the verification condition imposes conflicting requirements in terms of programming (or erasure) time and readout reliability. For example, selecting a larger permitted count and/or a lower (higher) verification threshold in programming (erasure) results in a relaxed verification condition.

Using a relaxed verification condition is advantageous since it typically takes fewer iterations to meet the verification condition, thus shortening the programming/erasure procedure duration. On the other hand, a more demanding verification condition may achieve higher readout reliability during the life time of the device than a relaxed verification condition, but will typically require a larger number of P&V or E&V iterations. In addition, a demanding verification condition may result in over-programming or erase over-stress of memory cells that meet the verification condition at earlier iterations, which degrades the device performance. For example, configuring the number of allowed failing bits in erase operation to a small value may result in erase over-stress, which in turn reduces the number of attainable program and erase (P/E) cycles.

In programming and erasing practical memory devices, some of the memory cells are significantly slower than others in responding to programming or erasure. The slower cells typically comprise a small fraction of the entire memory cell population. To allow the slower cells to program and erase successfully, the memory device may apply a relaxed verification condition across the entire device. This programming (or erasure) scheme, however, may degrade the readout reliability of both the slower cells and cells that could be programmed or erased using a more demanding verification condition.

In the disclosed techniques, during the first P&V or E&V iterations, the memory device applies a demanding verification condition that enables the majority of the memory cells to be programmed or erased successfully. If after a predefined number of iterations in which the demanding verification condition is applied the operation has not yet succeeded, the memory device relaxes the verification condition and applies one or more additional iterations using the relaxed verification condition. By changing the verification condition only after a certain number of iterations, the majority of the memory cells are programmed and erased using a demanding verification condition and only a small fraction of slower cells are programmed using a relaxed verification condition for which reliability may degrade.

Note that in certain situations, the relaxed verification condition is met even without applying additional iterations. In such cases, the operation is considered successful when relaxing the verification condition, and no iterations with the relaxed verification condition are required.

In some embodiments, relaxing the verification condition comprises increasing the permitted count of failed bits, changing the verification threshold, or both. Changing the verification threshold typically comprises decreasing the verification threshold for programming and increasing the verification threshold for erase.

In some embodiments, in a given iteration, the memory cells not yet meeting the verification threshold are classified into two or more verification zones according to their analog values, and the verification condition is based on the number of memory cells per verification zone. In an example embodiment, a larger permitted count of failed bits may be assigned to verification zones that are closer to the verification threshold, because read errors in these zones may be successfully corrected with higher probability by an error correction code (ECC).

In some embodiments, the memory device controls the extent of relaxation based on the ECC error correction capability, the number of program and erase (P/E) cycles performed so far, and/or the number of cells that met the verification threshold for the first time in the most recent iteration. By controlling the extent of relaxation, the memory device may control the expected degradation level due to program disturb, read disturb and retention.

System Description

FIG. 1 is a block diagram that schematically illustrates a memory system 20, in accordance with an embodiment that is described herein. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise solid-state analog memory cells 32 of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein additionally apply to storage densities of a non-integer number of bits per memory cell, i.e., a number of programming levels that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having an integer resolution of one or more bits. Data is typically written to and read from the memory cells in groups that are referred to as pages. In some embodiments, the R/W unit can erase a group of cells 32 by applying one or more negative erasure pulses to the cells.

In some embodiments, when programming or erasing a plurality of memory cells, the R/W unit sets the memory cells to respective target analog values, by applying to the memory cells a sequence of program-and-verify (P&V) or erase-and-verify (E&V) iterations. In each such iteration the R/W unit attempts to set the memory cells to assume the target analog values and then verifies whether the target analog values have been reached in accordance with a verification condition.

For example, in some embodiments, the R/W unit may count the number of memory cells that have not reached a predefined verification threshold, and require that the counted number is smaller than a predefined permitted count. After applying a predefined number of iterations without meeting the verification condition, the R/W unit relaxes the verification condition and applies one or more additional iterations using the relaxed verification condition. Methods for relaxing the verification condition are described in detail below.

The storage and retrieval of data in and out of memory device 24 is performed by a memory controller 40. Memory controller 40 comprises an interface 44 for communicating with memory device 24, a processor 48, and an Error Correcting Code (ECC) unit 50. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. ECC unit 50 encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used.

Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24, e.g., in a RAID storage system. Elements that are not necessary for understanding the principles of the present disclosure, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Relaxing Verification Condition in Program and Erase Operations

Figure 2:
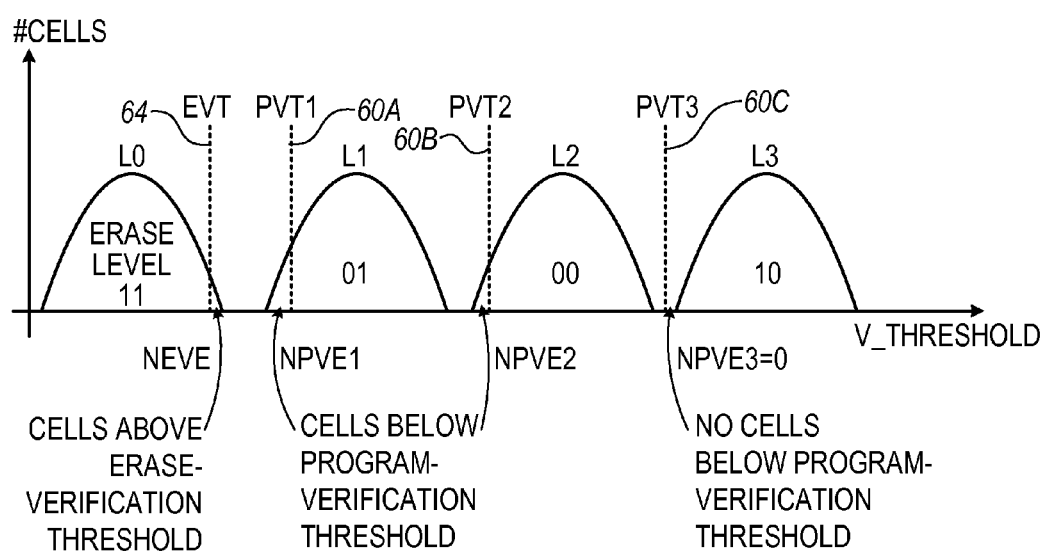
FIG. 2 is a diagram that schematically illustrates threshold voltage distributions of memory cells in a 2 bit/cell MLC device, including verification thresholds used in program and erase operations, in accordance with an embodiment that is described herein.

FIG. 2 is a diagram that schematically illustrates threshold voltage distributions of a group of memory cells, including verification thresholds used in program and erase operations, in accordance with an embodiment that is described herein. The horizontal axis is a threshold-voltage axis, i.e., an axis depicting the analog values of the memory cells. In FIG. 2, L0 . . . L3 denote nominal programming levels of a 2 bit/cell MLC device and their respective threshold-voltage distributions. In the present example, L0 also denotes an erase level.

Vertical lines 60A, 60B and 60C (denoted PVT1, PVT2 and PVT3, respectively) depict program verification thresholds (PVTs) that R/W unit 36 uses when programming the memory cells to respective levels L1, L2 and L3. The PVTs are typically set below the respective nominal target levels. A vertical line 64 depicts an erase verification threshold (EVT) that the R/W unit uses when erasing the memory cells to level L0. EVT is typically set higher than the nominal target erase level. Typically, level L0 has negative threshold voltages, whereas levels L1, L2 and L3 have positive threshold voltages.

In an embodiment, to program the memory cells to a given programming level, the R/W unit applies to the memory cells a sequence of P&V iterations, wherein in each P&V iteration the R/W unit applies a programming pulse to one or more of the cells in an attempt to set the analog values of the memory cells to the given programming level. Typically, when the P&V iterations advance, the number of memory cells pushed above the verification threshold increases. A memory cell whose respective analog value passes above the respective PVT is referred to herein as a cell meeting the PVT. The programming operation is considered successful when the number of memory cells meeting the respective PVT does not exceed a predefined permitted count.

Similarly, to erase the memory cells, the R/W unit applies to the memory cells a sequence of E&V iterations, wherein in each E&V iteration the R/W unit applies to the cells one or more erasure pulses in an attempt to erase the memory cells to level L0. A memory cell whose analog value falls below EVT is referred to herein as a cell meeting the EVT. The erasure operation is considered successful when the number of memory cells meeting the EVT does not exceed a predefined permitted count. Note that the permitted count for erase verification may be different from the permitted count used for programming verification.

In FIG. 2, the area under the graph of distribution L1 and below verification threshold PVT1, denoted NPVE1, represents the number of memory cells being programmed to target level L1 and that fail to meet PVT1. Similarly, the area PNVE2 under the graph of distribution L2 and below PVT2 represents the number of memory cells being programmed to L2 and that fail to meet PVT2. Note that in the present example, all the cells targeted to L3 have analog values above PVT3, i.e., NPVE3=0. In FIG. 2, the area under the graph of distribution L0 and above EVT, denoted NEVE, represents the number of cells being erased whose value is still above verification threshold EVT.

As described above, the R/W unit decides whether the programming or erase operation has been successful or not by testing a verification condition that is based on the position of the verification threshold along the voltage threshold axis, and on the number of memory cells that are permitted not to reach this verification threshold.

In the disclosed embodiments, the verification condition changes dynamically over the iterations. In some embodiments, the R/W starts with an initial demanding verification condition, and if the program or erase operation does not succeed within a predefined number of iterations, the R/W unit relaxes the verification condition and applies one or more additional iterations using the relaxed verification condition. As will be described in more detail below, relaxing the verification condition may involve changing the permitted count, the verification threshold, or both.

Figure 3:
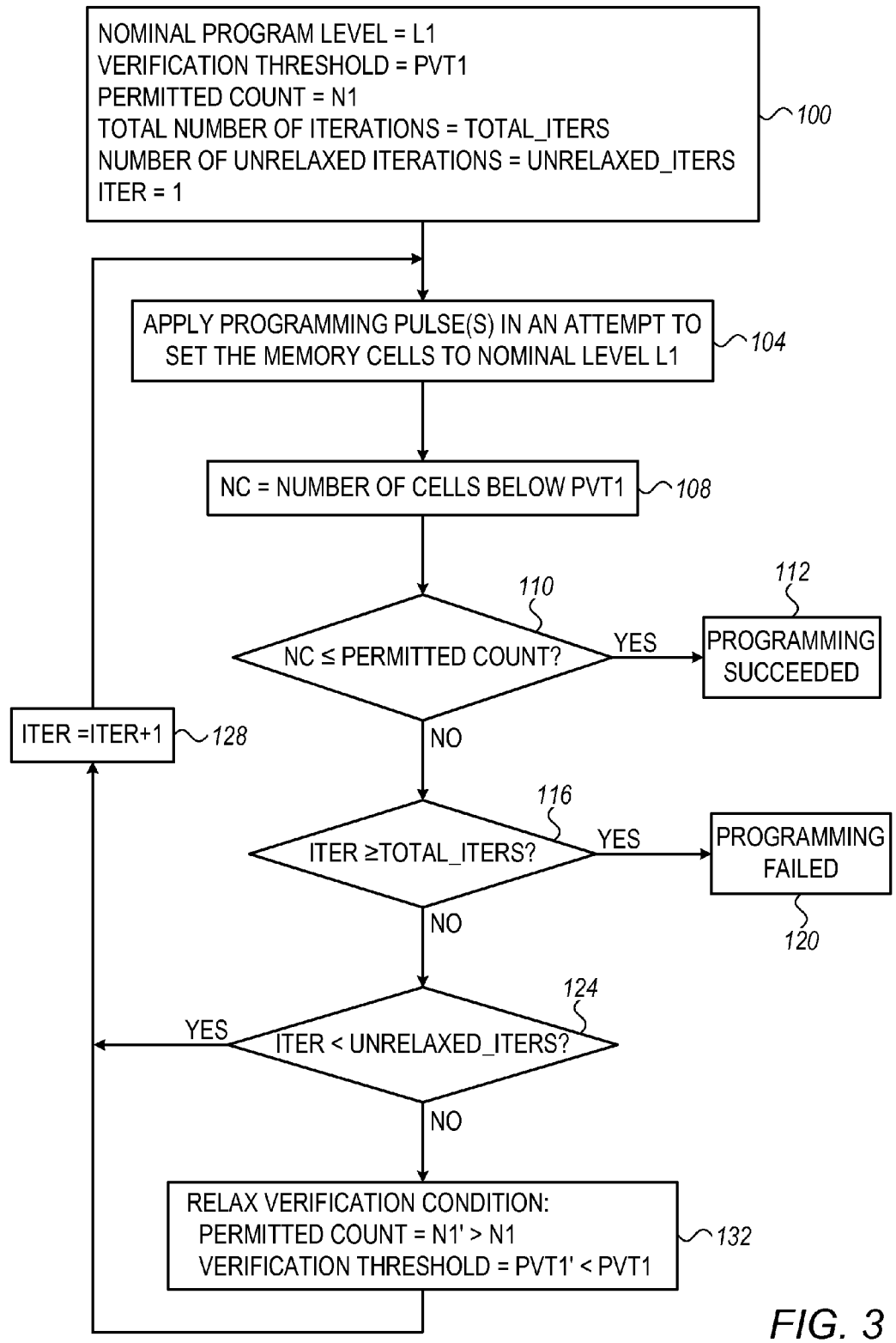
FIG. 3 is a flow chart that schematically illustrates a method for programming a group of memory cells including relaxing a verification condition, in accordance with an embodiment that is described herein.

FIG. 3 is a flow chart that schematically illustrates a method for programming a group of memory cells including relaxing a verification condition, in accordance with an embodiment that is described herein. The method will be described with respect to a programming operation in which the R/W unit programs a group of memory cells to level L1 of FIG. 2. This operation corresponds, for example, to a Least-Significant Bit (LSB) programming, wherein the group of memory cells comprises the memory cells for which LSB="0".

The method begins with the R/W unit initializing a programming operation that aims to program the group of memory cells to level L1, at an initialization step 100. The R/W unit sets the requested nominal level to L1 and the respective verification threshold to PVT1. The R/W unit additionally initializes a permitted count to N1, wherein the permitted count is the maximal number of memory cells allowed to be below PVT1 for the programming operation to succeed. Further at step 100, the R/W unit initializes N_ITERS—the total number of iterations, UNRELAXED_ITERS—the maximal number of iterations that should be applied before relaxing the verification condition, and ITER=1—the iterations counter.

In an example embodiment, for programming operations, the memory device initializes PVT1=0.5V, and N1=50 (assuming a 4 KB sector). The memory device applies up to N_ITER=20 programming iterations, of which up to UNRELAXED_ITERS=15 are carried out before relaxing the verification condition. For erasure operations, the memory device initializes EVT1=−2V, and N1=10 (assuming a 4 KB sector). The memory device applies up to N_ITER=5 erasure iterations, of which up to UNRELAXED_ITERS=2 are carried out before relaxing the verification condition. Alternatively, any other suitable parameters can also be used.

At a programming step 104, the R/W unit applies to the memory cells one or more programming pulses in an attempt to set the memory cells to level L1. At a counting step 108, the R/W unit senses the memory cells and counts the number of memory cells (NC) whose analog values, after the programming phase of step 104, still fall below PVT1.

At a verification step 110, the R/W unit compares NC to the permitted count. If at step 110 NC does not exceed the permitted count, the R/W unit proceeds to a success reporting step 112. At step 112, the R/W unit reports to memory controller 40 that the programming operation has succeeded and the method terminates.

If at step 110 NC exceeds the permitted count, the R/W unit proceeds to an iterations termination step 116, in which the R/W unit checks whether the current iteration is the last iteration, and if so, the R/W unit proceeds to a failure reporting step 120. At step 120 the R/W unit reports to the memory controller that the programming operation has failed, and the method then terminates.

If at step 116 ITER<TOTAL_ITERS, the R/W unit proceeds to a relaxation checking step 124, in which the R/W unit checks whether a number of UNRELAXED_ITERS iterations have already been applied. If at step 124 less than UNRELAXED_ITERS iterations have been applied, the R/W unit increments counter ITER at an incrementing step 128 and loops back to step 104 to apply subsequent P&V iterations using the unrelaxed verification condition.

If at step 124 the R/W unit discovers that a number of UNRELAXED_ITERS have already been applied, the R/W unit relaxes the verification condition at a relaxation step 132, before applying further iterations. In some embodiments, the R/W unit relaxes the verification condition by increasing the permitted count to N1'>N1. In other embodiments, the R/W unit relaxes the verification condition by decreasing the verification threshold to PVT1'<PVT1 (PVT1' in not shown in FIG. 2). In yet other embodiments, at step 124 the R/W unit changes both the permitted count to N1'>N1 and the verification threshold to PVT1'<PVT1.

In an embodiment, e.g., the example embodiment described above, when relaxing the verification condition for programming, PVT1 is relaxed to PVT1'=PVT1−100 mv and N1 is relaxed to N1'=N1−20. Similarly, when relaxing the verification condition for erasure, EVT1 is relaxed to EVT1'=EVT+300 mv and N1 is relaxed to N1'=N1−10. In alternative embodiments, any other suitable relaxation parameters can also be used.

In some embodiments, the R/W unit may control the extent of relaxation to apply at step 132. For example, the relaxation extent may refer to the amount by which to increase the permitted count, or to the analog amount by which to decrease the verification threshold PVT1. The R/W unit may determine the relaxation extent based on one or more factors, such as, for example, the correction capability of ECC 50, the program and erase (P/E) cycle count of the block being programmed, and the number of memory cells that have passed the verification threshold for the first time in the previous iteration. Alternatively or additionally, the R/W unit can use any other suitable factors for determining the relaxation degree.

Following step 132, the R/W unit proceeds to step 128 to increment ITER and loops back to step 104 to apply subsequent iterations using the relaxed verification condition.

In the method of FIG. 3, upon failure, the R/W unit reports to the memory controller a pass/fail status at steps 112 and 120, respectively. In alternative embodiments, at step 120, the R/W unit sends to the memory controller a detailed failure report including the number of memory cells that failed to meet the verification threshold. The failure report is typically sent without a hard pass/fail decision. In response to receiving the detailed failure report, the memory controller may ignore the report assuming that reading the programmed data will succeed, or mark the block as unusable. Alternatively, the memory controller may re-attempt the failed programming operation, or decide whether the block is usable or not, for example, by applying one or more read operations at different read conditions and analyzing the read outcomes.

As noted above, at step 110 the R/W unit verifies whether the programming operation has succeeded or not by distinguishing between memory cells that are below and above the verification threshold. In this embodiment, all the memory cells below the verification threshold are weighted equally, regardless of the proximity of each cell's value to the verification threshold.

In alternative embodiments, the R/W unit further classifies the memory cells that are below the verification threshold into two or more verification zones, and performs the verification based on the numbers of cells per zone. In an example embodiment, the R/W unit uses a classification threshold CTV1<PVT1, and defines the range between CTV1 and PVT1 as a first zone, and the range below CTV1 as a second zone. The verification condition in this case may require that the number of cells in each zone would not exceed a respective permitted count. For example, since at reading time, read errors in cells that belong to the first zone (i.e., closer to PVT1) may be corrected with higher probability than read errors in cells that belong to the second zone, the R/W unit may assign to the first zone a larger permitted count. In other embodiments, the R/W unit calculates a weighted sum of the per-zone number of cells and compares the weighted sum to a predefined permitted count. Further alternatively, the R/W unit may perform the verification based on calculating any other suitable function of the per-zone number of cells.

The methods described above are given by way of example, and in alternative embodiments other suitable methods can also be used. For example, although the method of FIG. 3 refers mainly to a programming operation, the method may be similarly applied to erasure operations. For example, in erase operation, relaxing the verification threshold comprises increasing the verification threshold.

As another example, in some embodiments a group of memory cells can be programmed into two or more programming levels simultaneously. For example, in programming the MSB page in a 2 bit/cell MLC device two programming levels are typically programmed simultaneously. In such embodiments, cells that are programmed to different levels are compared to different verification thresholds, and the numbers of cells below the respective thresholds may be limited using separate permitted counts or combined and compared to a single permitted count.

In the techniques disclosed above, the verification condition was relaxed once. In alternative embodiments, the R/W unit may relax the verification condition two or more times, in accordance with respective relaxation degrees. For example, the R/W unit may apply relaxation with higher degree each time the R/W unit changes the verification condition.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
setting a plurality of memory cells to hold respective target analog values, by applying to the memory cells a sequence of iterations, wherein each iteration comprises attempting to set the target analog values and then verifying whether the target analog values have been reached in accordance with a verification condition; and
after applying a predefined number of the iterations, relaxing the verification condition and verifying whether the target analog values have been reached in accordance with the relaxed verification condition, by counting a number of the memory cells whose analog values do not meet a verification threshold, and deciding that the verification condition is met when the counted number does not exceed a predefined permitted count.

2. The method according to claim 1, wherein verifying whether the target analog values have been reached in accordance with the relaxed verification condition further comprises applying one or more additional iterations using the relaxed verification condition.

3. The method according to claim 2, wherein verifying whether the target analog values have been reached further comprises notifying a number of the memory cells failing to meet the relaxed verification condition after applying a predefined number of the additional iterations.

4. The method according to claim 1, wherein relaxing the verification condition comprises increasing the predefined permitted count.

5. The method according to claim 1, wherein relaxing the verification condition comprises adjusting the verification threshold.

6. The method according to claim 1, wherein setting the plurality of the memory cells comprises programming the memory cells with data, wherein counting the number of the memory cells comprises identifying the memory cells whose analog values fall below the verification threshold, and wherein relaxing the verification condition comprises decreasing the verification threshold.

7. The method according to claim 1, wherein setting the plurality of the memory cells comprises erasing the memory cells, wherein counting the number of memory cells comprises identifying the memory cells whose analog values fall above the verification threshold, and wherein relaxing the verification condition comprises increasing the verification threshold.

8. The method according to claim 1, and comprising classifying the analog values of the memory cells whose analog values do not meet the verification threshold into two or more verification zones, and wherein verifying whether the target analog values have been reached comprises counting per-zone numbers of the memory cells in the respective verification zones and verifying whether the target analog values have been reached based on the counted per-zone numbers.

9. The method according to claim 8, wherein verifying whether the target analog values have been reached comprises using a respective different permitted count per verification zone.

10. The method according to claim 8, wherein the verification zones include a first zone having a first number of the memory cells and a second zone having a second number of the memory cells, wherein the first zone is closer to the verification threshold than the second zone, and wherein verifying whether the target analog values have been reached comprises comparing the first number to a first permitted count and comparing the second number to a second permitted count that is smaller than the first permitted count.

11. A method for data storage, comprising:
setting a plurality of memory cells to hold respective target analog values, by applying to the memory cells a sequence of iterations, wherein each iteration comprises attempting to set the target analog values and then verifying whether the target analog values have been reached in accordance with a verification condition; and
after applying a predefined number of the iterations, relaxing the verification condition and verifying whether the target analog values have been reached in accordance with the relaxed verification condition,
wherein relaxing the verification condition comprises determining an extent by which to relax the verification condition based on at least one factor selected from a group consisting of correction capability of an Error Correction Code (ECC) used for the data storage, a count of program and erase (P/E) cycles applied previously to the memory cells, and a number of the memory cells that met the verification threshold for the first time in a most recent iteration.

12. An apparatus for data storage, comprising:
a plurality of memory cells; and
storage circuitry, which is configured to set the plurality of memory cells to hold respective target analog values, by applying to the memory cells a sequence of iterations, wherein in each iteration the storage circuitry is configured to attempt to set the target analog values and then to verify whether the target analog values have been reached in accordance with a verification condition, and, after applying a predefined number of the iterations, to relax the verification condition and to verify whether the target analog values have been reached in accordance with the relaxed verification condition, by counting a number of the memory cells whose analog values do not meet a verification threshold, and deciding that the verification condition is met when the counted number does not exceed a predefined permitted count.

13. The apparatus according to claim 12, wherein the storage circuitry is further configured to verify whether the target analog values have been reached in accordance with the relaxed verification condition by applying one or more additional iterations using the relaxed verification condition.

14. The apparatus according to claim 12, wherein the storage circuitry is configured to relax the verification condition by increasing the predefined permitted count.

15. The apparatus according to claim 12, wherein the storage circuitry is configured to relax the verification condition by adjusting the verification threshold.

16. The apparatus according to claim 12, wherein the storage circuitry is configured to set the plurality of the memory cells so as to program the memory cells with data, to identify the memory cells whose analog values fall below the verification threshold, and to relax the verification condition by decreasing the verification threshold.

17. The apparatus according to claim 12, wherein the storage circuitry is configured to set the plurality of the memory cells so as to erase the memory cells, to identify the memory cells whose analog values fall above the verification threshold, and to relax the verification condition by increasing the verification threshold.

18. The apparatus according to claim 12, wherein the storage circuitry is configured to classify the analog values of the memory cells whose analog values do not meet the verification threshold into two or more verification zones, to count per-zone numbers of the memory cells in the respective verification zones and to verify whether the target analog values have been reached based on the counted per-zone numbers.

* * * * *